United States Patent [19]

Okamoto et al.

[11] Patent Number: 4,599,532
[45] Date of Patent: Jul. 8, 1986

[54] SURFACE ACOUSTIC WAVE DEVICE WITH ANTI-REFLECTION ELECTRODE STRUCTURE

[75] Inventors: Takeshi Okamoto; Shoichi Minagawa, both of Tokyo, Japan

[73] Assignee: Clarion Co., Ltd., Tokyo, Japan

[21] Appl. No.: 627,876

[22] Filed: Jul. 5, 1984

[51] Int. Cl.$^4$ .............................................. H03H 9/42
[52] U.S. Cl. ........................... 310/313 D; 310/313 B; 333/194
[58] Field of Search ........... 310/313 R, 313 A, 313 B, 310/313 D; 333/151, 154, 194, 195, 196

[56] References Cited

U.S. PATENT DOCUMENTS

| | | | |
|---|---|---|---|
| 4,005,376 | 1/1977 | Davis | 310/313 A |
| 4,204,178 | 5/1980 | Mitchell | 310/313 D |
| 4,281,301 | 7/1981 | Stevens et al. | 333/195 |
| 4,340,834 | 7/1982 | Sato | 310/313 D |

*Primary Examiner*—Patrick R. Salce
*Assistant Examiner*—D. L. Rebsch

*Attorney, Agent, or Firm*—Russell E. Hattis; Stephen R. Arnold

[57] ABSTRACT

A surface acoustic wave device comprises a piezoelectric substrate, a pair of transducers provided on the piezoelectric substrate, a center electrode provided in the center between the both transducers, first shield electrode provided between one of the transducers and the center electrode, and second shield electrode provided between the other transducer and the center electrode, with placement substantially represented by:

$$l_1 = \lambda_0 \left( \frac{1}{12} + \frac{n_1}{2} \right) \text{ and } l_2 = \lambda_0 \left( \frac{1}{12} + \frac{n_2}{2} \right)$$

where $l_1$ is the width of the individual shield electrodes, $l_2$ is the distance from the individual shield electrodes to the center electrode, $\lambda_0$ is the wavelength of a surface acoustic wave at the center frequency, and $n_1$ and $n_2$ are whole numbers.

4 Claims, 8 Drawing Figures

SURFACE ACOUSTIC WAVE DEVICE WITH ANTI-REFLECTION ELECTRODE STRUCTURE

FIELD OF THE INVENTION

This invention relates to a surface acoustic wave device eliminating reflections of surface acoustic waves by a center electrode, and also eliminating influences by direct waves which have not been converted to surface acoustic waves by transducers.

BACKGROUND OF THE INVENTION

There are many kinds of surface acoustic wave devices such as surface acoustic wave amplifier, convolver, correlator, etc. which utilize non-linearity of a piezoelectric material such as single crystal piezoelectric material, piezoelectric film, piezoelectric ceramic, etc. or non-linearity of increase and decrease of a depletion layer in a semiconductor combined with a piezoelectric film.

FIGS. 1 and 2 are cross-sectional views, each illustrating a prior art structure of such a surface acoustic wave device. Reference numeral 1 refers to a piezoelectric substrate comprising a piezoelectric material of single crystal type, piezoelectric ceramic, or the like, reference numerals 2 and 3 refers to a pair of transducers which have an interdigital configuration, and 4 refers to a center electrode disposed in the center between the transducers 2 and 3 and including a bottom surface electrode 5. Reference numeral 6 refers to a non-piezoelectric substrate comprising a semiconductor, for example, and 7 refers to a piezoelectric film provided on the substrate 6.

With this arrangement, incident surface acoustic waves 9 from the transducers 2 and 3 to the center electrode 4 are partly reflected by the center electrode 4 and become reflected waves 8, as shown in FIG. 3. This invites waveform distortions of output signals from the device.

Such waveform distortions to output signals or deteriorations of surface wave processing characteristics of the device is also often caused by direct waves which have failed to be converted to surface acoustic waves by the transducers 2 and 3 and travel to the center electrode 4 as electromagnetic waves.

SUMMARY OF THE INVENTION

It is therefore an object of the invention to provide a surface acoustic wave device eliminating reflections of surface acoustic waves by a center electrode.

Another object of the invention is to provide a surface acoustic wave device eliminating influences by direct waves which were not converted to surface acoustic waves by transducers and propagate to the center electrode as electromagnetic waves.

To attain said objects, the surfaces acoustic wave device according to the invention provides first shield electrode between one of paired transducers and a center electrode, and second shield electrode between the other transducer and the center electrode. The first and second shield electrodes and the center electrode optionally meet placement requirements represented by $l_1 = \lambda_0(1/12 + n_1/2)$ and $l_2 = \lambda_0(1/12 + n_2/2)$ where $l_1$ is the width of the individual shield electrodes in the direction of surface acoustic wave propagation, $l_2$ is the distance from the individual shield electrodes to the center electrode, $n_1$ and $n_2$ are whole numbers, and $\lambda_0$ is the wavelength of a surface acoustic wave at the central frequency.

The invention will be better understood from the belowgiven description by way of preferred embodiments illustrated in the drawings.

DETAILED DESCRIPTION OF THE PREFERRED EMBODIMENTS

Figure 4:
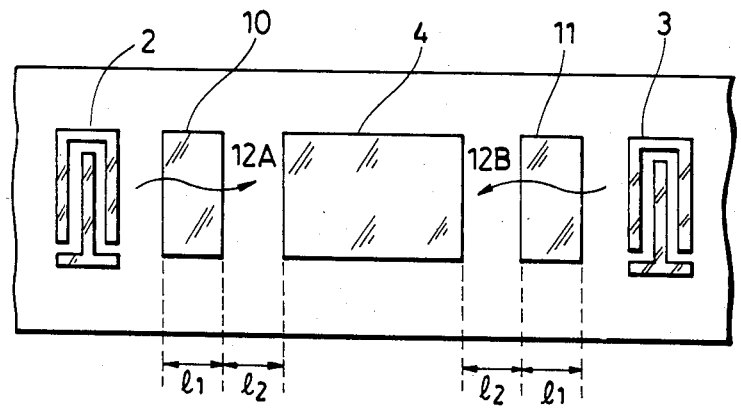
Figure 5:
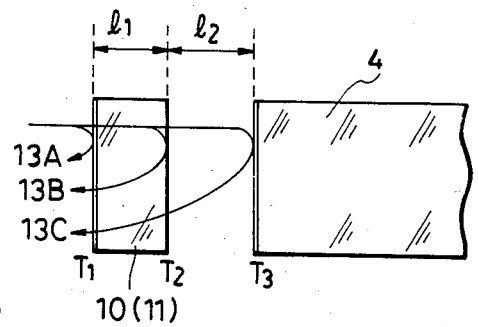

FIG. 4 is a top view of a surface acoustic wave device embodying the invention.

As in the prior art constructions, the surface acoustic wave includes a pair of transducers 2 and 3, and a central electrode 4 interposed between both transducers 2 and 3. The first shield electrode 10 is provided between the transducer 2 and the central electrode 4 whereas second electrode 11 is provided between the transducer 3 and the central electrode 4. The width $l_1$ of both shield electrodes 10 and 11 in the surface acoustic wave propagating directions (in the directions shown by arrows 12A and 12B in FIG. 4) is substantially represented by:

$$l_1 = \lambda_0(1/12 + n_1/2) \tag{1}$$

where $n_1$ is a whole number, and $\lambda_0$ is the wavelength of a surface acoustic wave at the central frequency. The distance $l_2$ between each shield electrode 10 (or 11) and the central electrode 4 is substantially represented by:

$$l_2 = \lambda_0(1/12 + n_2/2) \tag{2}$$

where $n_2$ is a whole number.

When incident surface acoustic waves from the transducers 2 and 3 to the central electrode 4 are partly reflected by end portions $T_1$, $T_2$ and $T_3$ of the shield electrodes 10 and 11 and of the central electrode 4 and become reflected waves 13A, 13B and 13C, the phases $P_B$ and $P_C$ of the reflected waves 13B and 13C with respect to the reflected wave 13A are expressed by:

$$P_B = 2l_1 \cdot 2\pi/\lambda_0 + \pi = \pi/3 + 2n_1\pi + \pi \tag{3}$$

$$\begin{aligned} P_C &= 2(l_1 + l_2) \cdot 2\pi/\lambda_0 \\ &= 2\pi/3 + 2\pi(n_1 + n_2) \\ &= 2\pi/3 + 2n\pi \end{aligned} \tag{4}$$

where $n = n_1 + n_2$.

Therefore, superposition on the individual reflected waves 13A, 13B and 13C makes a resulting wave with no amplitude. This means that no reflected wave of the surface acoustic waves exists.

The first and second shield electrodes 10 and 11 also prevent such a phenomenon that signals not converted to surface acoustic waves by the transducers 2 and 3 propagate to the central electrode 4 and give bad influences to outputs therefrom.

The above-described embodiment refers to a surface acoustic wave convolver wherein surface acoustic waves are generated by both transducers 2 and 3 and are reconverted to electric signal outputs by the central electrode 4. However, the invention also provides substantially the same effect when it is applied to a surface acoustic wave parametric amplifier wherein the central electrode 4 amplifies pumping signals applied thereto.

Figure 1:
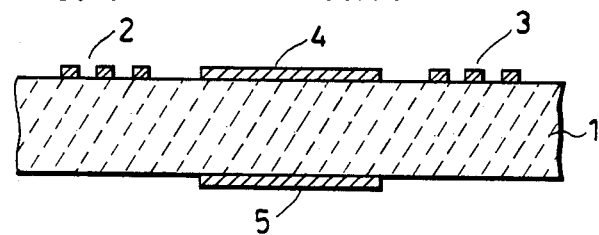
FIGS. 1 through 3 are cross-sectional views illustrating prior art constructions of surface acoustic wave device.
Figure 2:
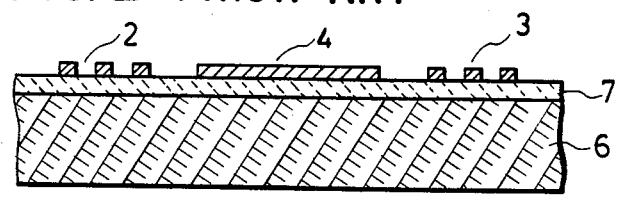
Figure 3:
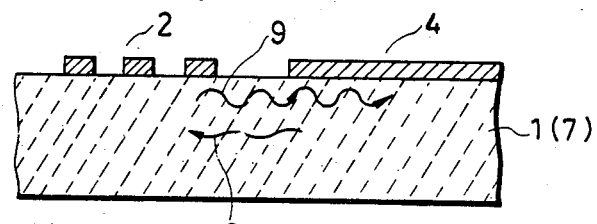
Figure 6:
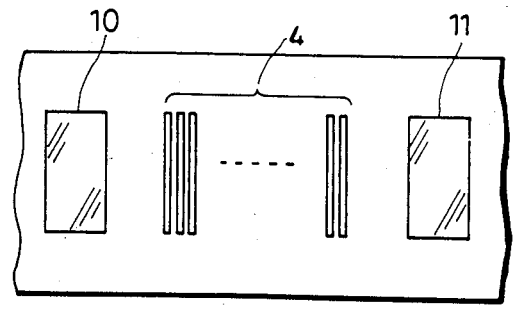
FIGS. 4 through 6 are top views illustrating preferred embodiments of the surface acoustic wave according to the invention.

FIG. 6 shows a further embodiment wherein the central electrode 4 comprises parallel and spaced plural strips. This embodiment also gives substantially the same effect.

Figure 7:
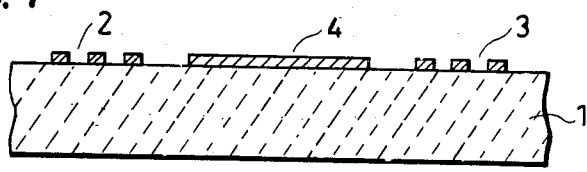
FIGS. 7 and 8 are cross-sectional views illustrating preferred structures of the piezoelectric substrate according to the invention.
Figure 8:
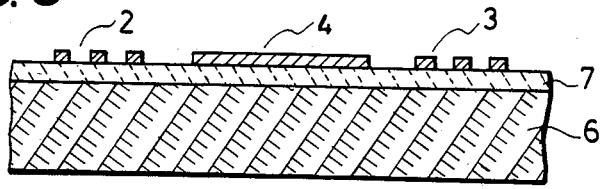

FIGS. 7 and 8 show structures of the piezoelectric substrate employed in the invention. The piezoelectric substrate of FIG. 7 consists of a single plate 1 made from a single crystal piezoelectric material, piezoelectric ceramic, etc. The substrate of FIG. 8 consists of a non-piezoelectric base plate 6 such as a semiconductor, and a piezoelectric film 7 made from zinc oxide, aluminium nitride, etc. and deposited on the base plate 6.

As described above, the invention provides a first shield electrode between one of paired transducers and a central electrode, and a second shield electrode between the other transducer and the central electrode, with placement represented by:

$$l_1 = \lambda_0\left(\frac{1}{12} + \frac{n_1}{2}\right) \text{ and } l_2 = \lambda_0\left(\frac{1}{12} + \frac{n_2}{2}\right)$$

where $l_1$ is the width of both shield electrodes in the direction of surface acoustic wave propagation, $l_2$ is the distance from both shield electrodes to the central electrode, $n_1$ and $n_2$ are whole numbers, and $\lambda_0$ is the wavelength of the surface acoustic wave at the central frequency. Therefore, the invention eliminates reflections of surface acoustic waves by the central electrode and also reduces electric signals which are not converted to surface acoustic waves that propagate up to the central electrode as electromagnetic waves.

The embodiment of the invention in which an exclusive property or privilege is claimed are defined as follows:

1. A surface acoustic wave device which comprises:
   a piezoelectric substrate;
   a pair of transducers provided on said piezoelectric substrate;
   a center electrode provided in the center between said transducers; and
   first and second shield electrodes provided between one of said transducers and said center electrode and between the other transducer and said center electrode, wherein the placement of said shield electrodes and central electrode is substantially represented by: $l_1 = \lambda_0(1/12 + n_1/2)$ and $l_2 = \lambda_0(1/12 + n_2/2)$ wherein $l_1$ is the width of said shield electrodes in the direction of surface acoustic wave propagation, $l_2$ is the distance from said shield electrodes to said center electrode, $\lambda_0$ is the wavelength of a surface acoustic wave at the central frequency, and $n_1$ and $n_2$ are whole numbers.

2. A surface acoustic wave device as claimed in claim 1 wherein said center electrode consists of a plurality of parallelly aligned and spaced strips.

3. A surface acoustic wave device as claimed in claim 1 wherein said piezoelectric substrate consists of a single plate of a piezoelectric material.

4. A surface acoustic wave device as claimed in claim 1 wherein said piezoelectric substrate consists of a base plate of a non-piezoelectric material and a piezoelectric film deposited on said base plate.

* * * * *